United States Patent [19]

Ninomiya

[11] Patent Number: 5,608,671
[45] Date of Patent: Mar. 4, 1997

[54] NON-VOLATILE SEMICONDUCTOR MEMORY

[75] Inventor: Kazuhisa Ninomiya, Tokyo, Japan

[73] Assignee: NEC Corporation, Tokyo, Japan

[21] Appl. No.: 564,812

[22] Filed: Nov. 29, 1995

[30] Foreign Application Priority Data

Nov. 29, 1994 [JP] Japan ................................ 6-294862

[51] Int. Cl.$^6$ ............................. G11C 11/34; G11C 7/00
[52] U.S. Cl. ............................. 365/185.29; 365/185.33; 365/218
[58] Field of Search ................. 365/185.29, 185.33, 365/218

[56] References Cited

U.S. PATENT DOCUMENTS 5,282,170  1/1994  Buskirk et al. ................. 365/185.33

*Primary Examiner*—David C. Nelms
*Assistant Examiner*—Trong Phan
*Attorney, Agent, or Firm*—Sughrue, Mion, Zinn, Macpeak & Seas

[57] ABSTRACT

A non-volatile semiconductor memory comprises a plurality of memory cells each composed of a floating gate field effect transistor, and an erasing circuit connected to a common source line connected to a source electrode of each of the memory cells. The erasing circuit includes first and second field effect transistors each of which has a source connected to an erasing voltage and a drain connected to the common source line. The first field effect transistor responds to a given erase signal to apply the erasing voltage to the common source line for the purpose of erasing date stored in the memory cells. The erasing circuit includes a control circuit for turning on the second field effect transistor when a voltage on the common source line becomes higher than a reference voltage, so that the erasing voltage is supplied through the first and second field effect transistor to the common source line.

4 Claims, 5 Drawing Sheets

NON-VOLATILE SEMICONDUCTOR MEMORY

BACKGROUND OF THE INVENTION

1. Field of the Invention

The present invention relates to a non-volatile semiconductor memory, and more specifically to an flash electrically erasable and programmable non-volatile semiconductor memory (flash EEPROM).

2. Description of Related Art

In the prior art, a non-volatile semiconductor memory includes a memory cell array, which is composed of a number of memory cells arranged in the form of a matrix, each of the memory cells being constituted of a floating gate field effect transistor (called a "FAMOS" hereinafter). A word line is located to extend along each of rows in the memory cell array, and a digit line is also located to extend along each of columns in the memory cell array. A row address decoder selectively activates one of the word lines, and a column address decoder also selectively activates one of the digit lines, so that one memory cell is selected. The digit lines are connected to sense amplifiers, so that the on/off condition of the selected memory cell is detected.

Here, the off condition of the memory cell can be set by a writing operation, by which electrons are injected into the floating gate of the FAMOS, so that a threshold voltage is elevated. On the other hand, the on condition of the memory cell is realized by an erasing operation for extracting the electrons stored in the floating gate of the FAMOS, so that the threshold voltage is lowered.

With the erasing operation of the non-volatile semiconductor memory, a plurality of memory cells are simultaneously erased in the flash memory. In this flash erasing operation, the potential of the source region of the FAMOSs are put to a high voltage during a predetermined constant period of time. With application of the high voltage to the source region of the FAMOSs, the electrons stored in the floating gate are extracted by a Fowler-Nordheim tunneling phenomenon, resulting in drop of the threshold voltage of the FAMOS.

Referring to FIG. 1, there is shown one example of an erase circuit used in a conventional non-volatile semiconductor memory.

As shown in FIG. 1, the erase circuit 2 receives an erase signal $\overline{ER}$ and drives a memory cell common source line VS, which is connected to a source electrode of FAMOS memory cells M00 to Mnm in a memory cell array 1. More specifically, the erase circuit 2 includes a pair of buffers 31 and 32, each of which has an input connected to receive the erase signal $\overline{ER}$. The buffer 32 is configured to output a signal having an amplitude reaching a Vpp level. An output $\overline{ER+sc\,0}$ of the buffer 31 is connected to a gate of an N-channel MOS transistor MN0, which has a source connected to ground and a drain connected to the common source line VS. An output $\overline{ER+sc\,0}$ (Vpp) of the buffer 32 is connected to a gate of a P-channel MOS transistor MP0, which has a source connected to an erasing voltage Vpp and a drain connected to the common source line VS.

Now, operation of the erase circuit shown in FIG. 1 will be described. In a condition other than the erasing operation, the erase signal $\overline{ER}$ is maintained at a high level. Therefore, the P-channel transistor MP0 is off and the N-channel transistor MN0 is on, so that the common source line VS is driven to the ground level.

In the erasing operation, the erase signal $\overline{ER}$ is brought to a low level, so that the N-channel transistor MN0 is turned off and the P-channel transistor MP0 is turned on. Thus, the common source line VS is driven toward the erasing voltage Vpp, so that the source region of each FAMOS memory cell is brought to the high voltage, and the erasing operation of the memory cells starts for the purpose of causing the electrons stored in the floating gate to be extracted to the source region.

It is known to persons skilled in the art that, in this source erasing method, a depletion layer is generated in the source region of the memory cell, because of a potential difference between the source region and the floating gate of the memory cell, with the result that there occurs a leakage current flowing from the source region of the memory cell to the substrate due to an inter-band tunneling phenomenon. The larger the potential difference between the source region and the floating gate of the memory cell is, the larger the leakage current flowing from the source region of the memory cell to the substrate becomes. In other words, the more the electrons stored in the floating gate is, namely, the higher the threshold value of the memory cell to be erased is, the larger the leakage current flowing from the source region of the memory cell to the substrate becomes.

Therefore, in the source erase type of flash EEPROM, the leakage current flowing from the source region of the memory cell to the substrate is large at an initial stage of the erasing operation, and lowers with the drop of the memory cell threshold voltage in accordance with the advance of the erasing. Accordingly, in the conventional erase circuit for driving the memory cell common source line with a high voltage, the P-channel MOS transistor MP0 shown in FIG. 1 has been constructed to have a small current supplying capacity, for the purpose of reducing the leakage current flowing from the source region of the memory cell to the substrate at an initial stage of the erasing operation.

Referring to FIG. 2, there is shown a characteristics diagram illustrating a relation between the memory cell common source line voltage and the leakage current flowing from the source region of the memory cell to the substrate. In the diagram shown in FIG. 2, the current supplying capacity of the P-channel MOS transistor MP0 is shown by a load line. The operating point moves along the load line with advance of the erasing operation, so that the leakage current flowing from the source region of the memory cell to the substrate and the memory cell common source line voltage change with advance of the erasing operation.

As seen from FIG. 2, when the leakage current flowing from the source region of the memory cell to the substrate changes with advance of the erasing operation, the memory cell common source line voltage elevates along the load line, and the driving current becomes smaller than a current value set by the initial stage of the erasing operation, with the result that the potential difference between the source region and the floating gate of the memory cell becomes insufficient or short, and therefore, the erasing time becomes long.

However, the prior art cannot solve this problem while making a possible solving means compatible with a request lowering the erasing power supply voltage, ceaselessly made by users.

SUMMARY OF THE INVENTION

Accordingly, it is an object of the present invention to provide a non-volatile semiconductor memory which has overcome the above mentioned defect of the conventional one.

Another object of the present invention is to provide an erasing circuit for use in a non-volatile semiconductor memory, capable of increasing the erasing speed of the memory cell so as to shorten the required erasing time, and also fulfilling a conventional request lowering the erasing power supply voltage.

The above and other objects of the present invention are achieved in accordance with the present invention by a non-volatile semiconductor memory comprising a plurality of memory cells each composed of a floating gate field effect transistor, and an erasing circuit connected to a common source line connected to a source electrode of each of the memory cells, the erasing circuit responding to a given erase signal to apply a high voltage to the common source line so as to erase date stored in the memory cells, the erasing circuit including a plurality of field effect transistors each of which has a source connected to an erasing voltage and a drain connected to the common source line, so that when the field effect transistor is turned on, the erasing voltage is supplied through the turned-on field effect transistor to the common source line, and the erasing circuit also including a control circuit comparing a voltage on the common source line with a reference voltage, for generating a logic signal on the basis of a logic combination of the erase signal and the result of the comparison, the logic signal being applied to a gate of the a given field effect transistor so as to selectively controlling an on/off condition of the given field effect transistor.

The above and other objects, features and advantages of the present invention will be apparent from the following description of preferred embodiments of the invention with reference to the accompanying drawings.

DESCRIPTION OF THE PREFERRED EMBODIMENTS

Figure 1:
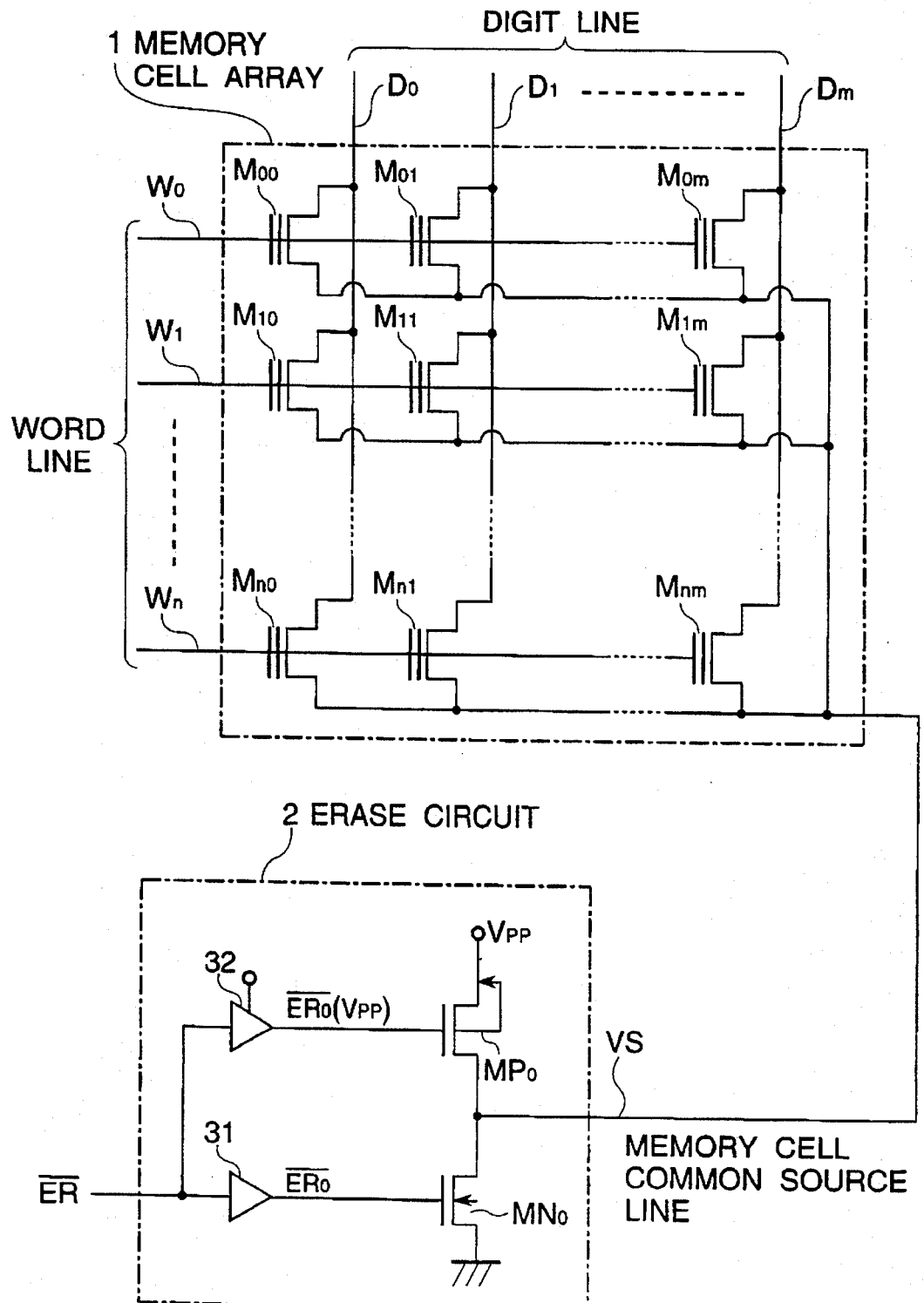
FIG. 1 is a circuit diagram of one example of an erase circuit used in a conventional non-volatile semiconductor memory.
Figure 2:
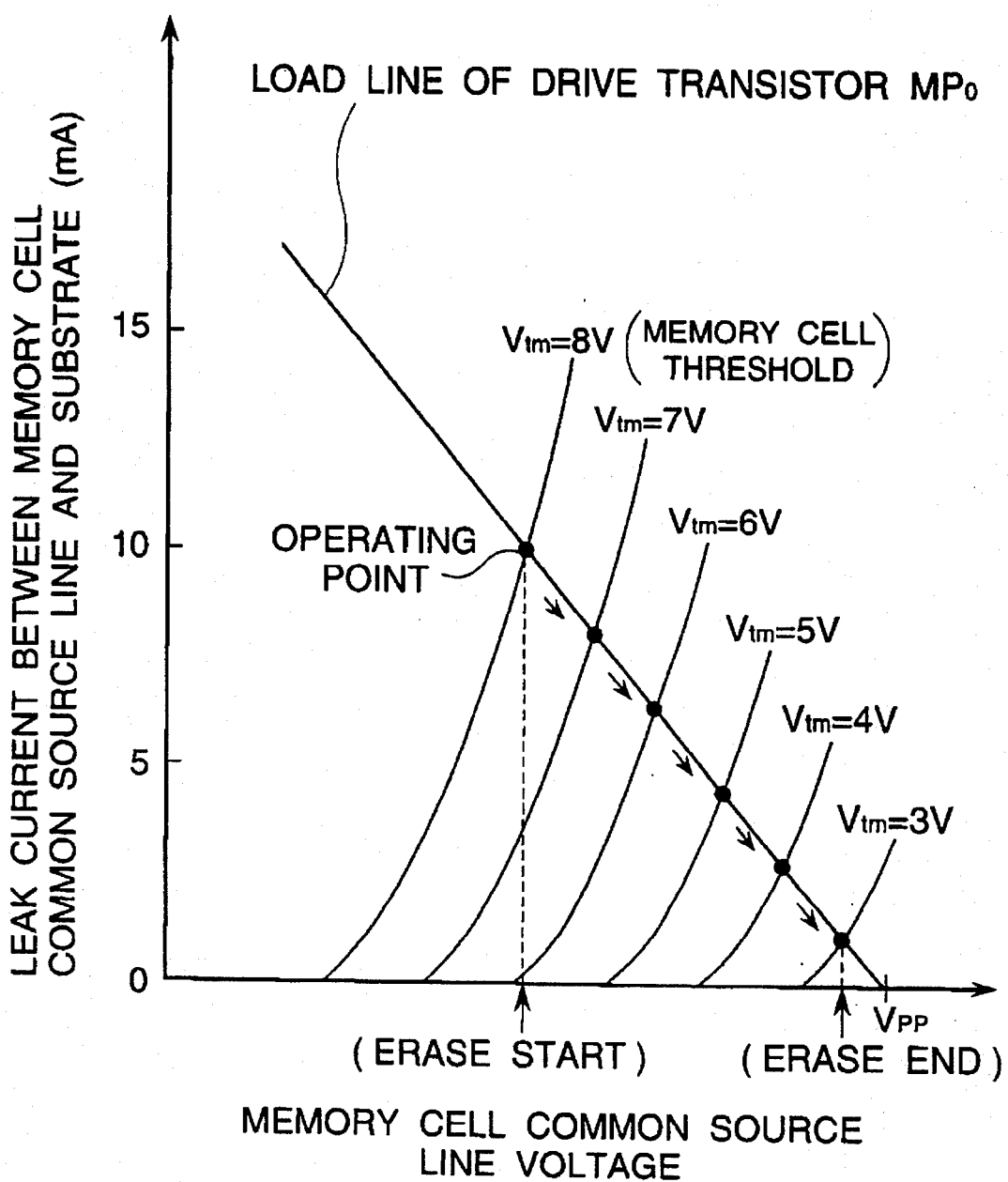
FIG. 2 is a characteristics diagram illustrating a relation, in the conventional erase circuit, between the memory cell common source line voltage and the leakage current flowing from the source region of the memory cell to the substrate.
Figure 3:
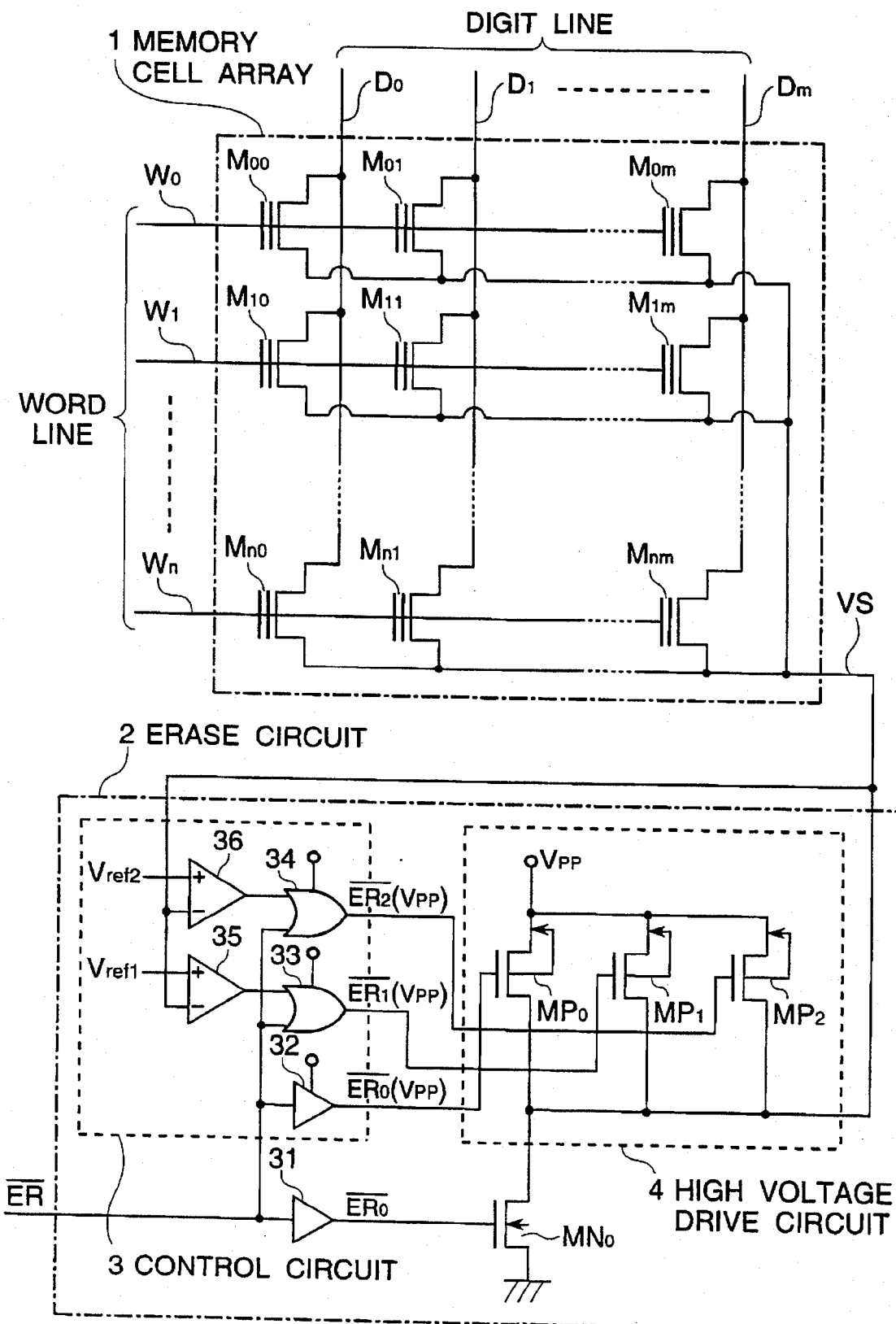
FIG. 3 is a circuit diagram of one embodiment of the erase circuit in accordance with the present invention, used in a non-volatile semiconductor memory.

Referring to FIG. 3, there is shown a circuit diagram of one embodiment of the erase circuit in accordance with the present invention, used in a non-volatile semiconductor memory.

The non-volatile semiconductor memory shown in FIG. 3 includes a memory cell array 1 composed of a number of FAMOS memory cells $M_{00}$ to $M_{nm}$ arranged along digit lines $D_0$ to $D_m$ and along word lines $W_0$ to $W_n$ in the form of a matrix. An erase circuit 2 in accordance with the present invention for driving a memory cell common source line VS connected to a source of each of the FAMOS memory cells $M_{00}$ to $M_{nm}$, receives an erase signal $\overline{ER}$ and a voltage on the common source line VS.

Specifically, the erase circuit 2 includes a buffer 31 receiving the erase signal $\overline{ER}$, for outputting an output signal $\overline{ER+sc\,0}$, a source-grounded N-channel MOS transistor $MN_0$ having a gate connected to an output of the buffer 31 and a drain connected to the common source line VS, and a control circuit 3 and a high voltage drive circuit 4.

The high voltage drive circuit 4 includes three parallel-connected P-channel MOS transistors $MP_0$, $MP_1$ and $MP_2$, each of which has a source connected to an erasing high voltage Vpp and a drain connected to the common source line VS.

The control circuit 3 includes a buffer 32 receiving the erase signal $\overline{ER}$, for outputting an output signal $\overline{ER+sc\,0}$ (Vpp) to a gate of the P-channel MOS transistors $MP_0$, a first OR gate 33 having a first input connected to receive the erase signal $\overline{ER}$, for outputting an output signal $\overline{ER+sc\,1}$ (Vpp) to a gate of the P-channel MOS transistor $MP_1$, a second OR gate 34 having a first input connected to receive the erase signal $\overline{ER}$, for outputting an output signal $\overline{ER+sc\,2}$ (Vpp) to a gate of the P-channel MOS transistor $MP_2$, a first comparator 35 having a non-inverting input connected to a first reference voltage Vref1 and an inverting input connected to the common source line VS, an output of the first comparator 35 being connected to a second input of the first OR gate 33, and a second comparator 36 having a non-inverting input connected to a second reference voltage Vref2 and an inverting input connected to the common source line VS, an output of the second comparator 35 being connected to a second input of the second OR gate 34.

The first comparator 35 outputs a low level signal when the voltage on the common source line VS is higher than the first reference voltage Vref1, and the second comparator 36 outputs a low level signal when the voltage on the common source line VS is higher than the second reference voltage Vref2. For example, the second reference voltage Vref2 is higher than the first reference voltage Vref1.

Now, operation will be described. In a condition other than the erasing operation, the erase signal $\overline{ER}$ is maintained at a high level. Therefore, the signals $\overline{ER+sc\,0}$, $\overline{ER+sc\,0}$ (Vpp), $\overline{ER+sc\,1}$ (Vpp) and $\overline{ER+sc\,2}$ (Vpp) are at a high level. Accordingly, the P-channel transistors $MP_0$, $MP_1$ and $MP_2$ are off and the N-channel transistor $MN_0$ is on, so that the common source line VS is driven to the ground level.

In the erasing operation, the erase signal $\overline{ER+sc\,0}$ is brought to a low level, so that the N-channel transistor $MN_0$ is turned off and the P-channel transistor $MP_0$ is turned on. Thus, the common source line VS is driven toward the erasing voltage Vpp, so that the source region of each FAMOS memory cell is brought to the high voltage, and the erasing operation of the memory cells starts for the purpose of causing the electrons stored in the floating gate to be extracted to the source region.

Figure 4:
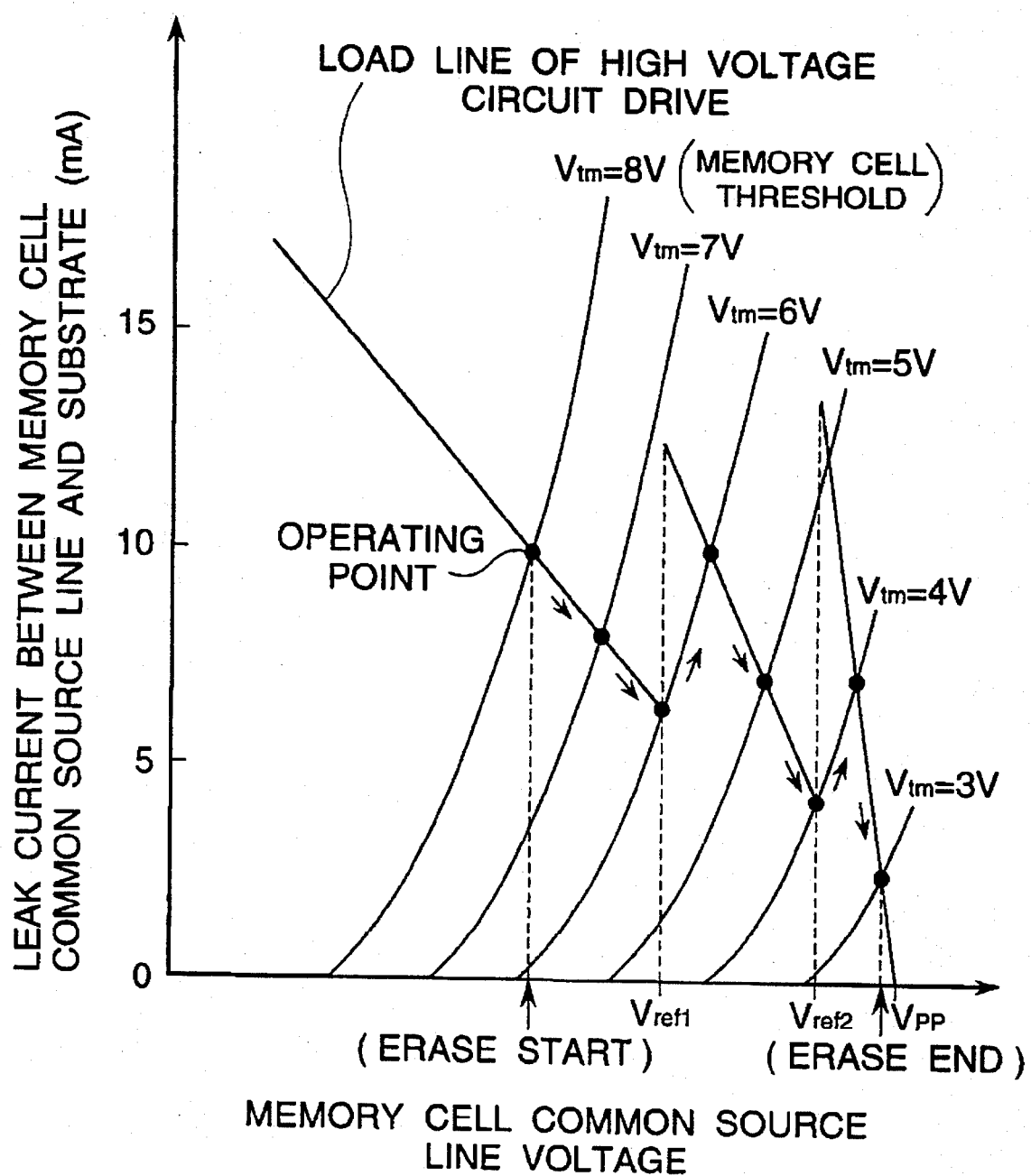
FIG. 4 is a characteristics diagram illustrating a relation, in the erase circuit in accordance with the present invention, between the memory cell common source line voltage and the leakage current flowing from the source region of the memory cell to the substrate.

FIG. 4 is a characteristics diagram illustrating a relation between the memory cell common source line voltage and the leakage current flowing from the memory cell common source line VS to the substrate. In the diagram shown in FIG. 4, the synthesized current supplying capacity of the P-channel transistors MP0, MP1 and MP2 is shown by a load line. The operating point moves along the load Line with advance of the erasing operation, so that the leakage current flowing from the source region of the memory cell to the substrate and the memory cell common source line voltage change with advance of the erasing operation.

Figure 5:
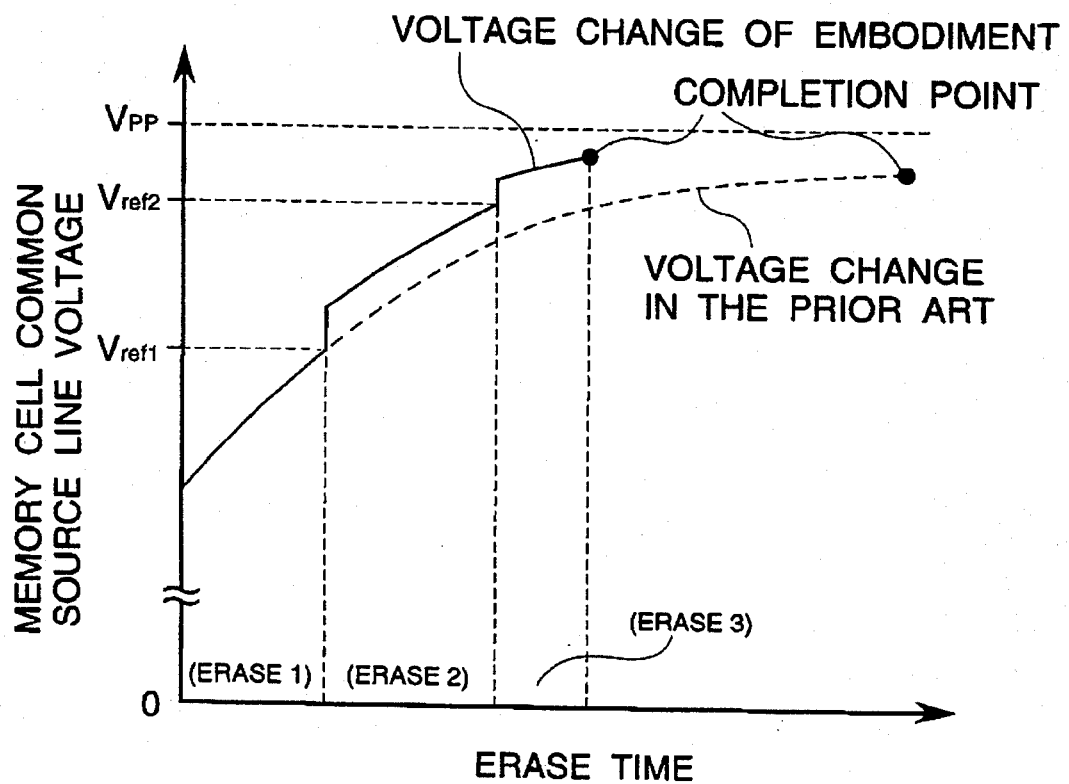
FIG. 5 is a voltage characteristics diagram illustrating the operation of the erase circuit in accordance with the present invention.
Figure 6:
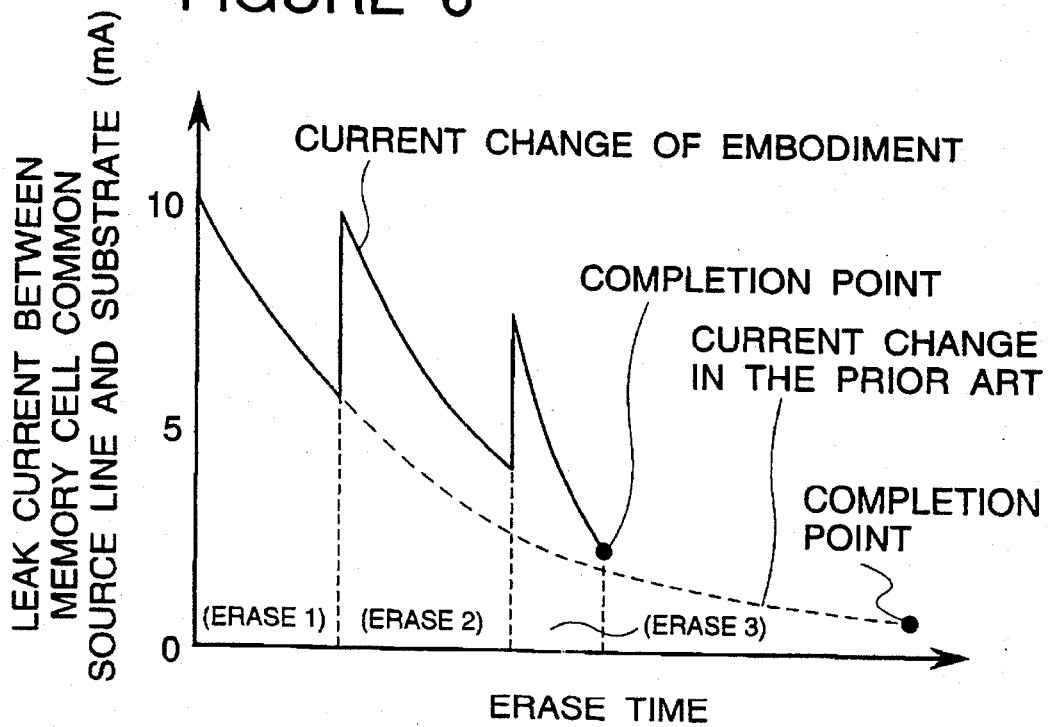
FIG. 6 is a current characteristics diagram illustrating the operation of the erase circuit in accordance with the present invention.

FIG. 5 illustrates that the voltage of the memory cell common source line VS changes with advance of the erasing operation, and FIG. 6 illustrates that the leakage current flowing from the memory cell common source line VS to the substrate changes with advance of the erasing operation.

At the moment the erasing operation starts, the voltage and the current of the memory cell common source line VS are in a period labelled "ERASE 1" in FIGS. 5 and 6. In this period "ERASE 1", with advance of the erasing operation, the voltage of the memory cell common source line VS elevates, and the current of the memory cell common source line VS lowers.

When the voltage on the common source line VS exceeds the first reference voltage Vref1, the output of the first comparator 35 is brought to the low level, so that the signal $\overline{ER+sc\ 1}$ (Vpp) is brought to the low level. Therefore, the P-channel transistor MP1 is turned on, so that the current supply capacity to the common source line VS is increased since the two P-channel transistors MP0 and MP1 are in the on condition. At this moment, the operating point of the voltage and the current shifts in accordance with the voltage characteristics of the leakage current flowing from the memory cell common source line VS to the substrate. Namely, the voltage and the current of the memory cell common source line VS shift to a period labelled "ERASE 2" in FIGS. 5 and 6.

Similarly, when the voltage on the common source line VS exceeds the second reference voltage Vref2, the output of the second comparator 36 is brought to the low level, so that the signal $\overline{ER+sc\ 2}$ (Vpp) is brought to the low level. Therefore, the P-channel transistor MP2 is turned on, so that the current supply capacity to the common source line VS is further increased since the three P-channel transistors MP0, MP1 and MP2 are in the on condition. At this moment, the operating point of the voltage and the current shifts in accordance with the voltage characteristics of the leakage current flowing from the memory cell common source line VS to the substrate. Namely, the voltage and the current of the memory cell common source line VS shift to a period labelled "ERASE 3" in FIGS. 5 and 6.

Here, if it is assumed that the moment the memory cell threshold voltage Vtm reaches 3 V, is an erase completion point, when the operating point of the voltage and the current of the memory cell common source line VS reaches a point corresponding to the memory cell threshold voltage Vtm of 3 V, the erase signal $\overline{ER}$ is brought to the high level to terminate the erasing operation.

In the above mentioned embodiment, the comparators are used for comparing the drive voltage on the memory cell common line with the respective reference voltages. However, it would be apparent to persons skilled in the art that a logic gate having a threshold level equal to the reference voltage can be used in place of each of the comparator.

As seen from the above, in the non-volatile semiconductor memory in accordance with the present invention, the erasing circuit includes a plurality of field effect transistors connected in parallel to each other, for applying an erasing high voltage to a common source line connected to a source electrode of each of the memory cells, and a control circuit comparing the voltage on the common source line with a reference voltage, for controlling the number of the turned-on transistor(s) of the plurality of field effect transistors for the purpose of compensating for the lowering of the current supply capacity. Therefore, the voltage elevation of the memory cell common source line is accelerated, so that the erasing speed of the memory cells is increased, namely, the erasing time is shortened.

In addition, since the current supply capacity to the common source line is controlled by changing the number of the turned-on transistor(s) of the plurality of field effect transistors connected in parallel between the memory cell common source line and the erasing high voltage, the condition requiring the lowering of the erasing power supply voltage does not change from that in the prior art. Therefore, it is easy to design the current supply capacity in development of products.

The invention has thus been shown and described with reference to the specific embodiments. However, it should be noted that the present invention is in no way limited to the details of the illustrated structures but changes and modifications may be made within the scope of the appended claims.

I claim:

1. A non-volatile semiconductor memory comprising a plurality of memory cells each composed of a floating gate field effect transistor, and an erasing circuit connected to a common source line connected to a source electrode of each of said memory cells, said erasing circuit responding to a given erase signal to apply a high voltage to said common source line so as to erase data stored in said memory cells, said erasing circuit including a plurality of field effect transistors each of which has a source connected to an erasing voltage and a drain connected to said common source line, so that when the field effect transistor is turned on, said erasing voltage is supplied through the turned-on field effect transistor to said common source line, and said erasing circuit also including a control circuit comparing a voltage on said common source line with a reference voltage, for generating a logic signal on the basis of a logic combination of said erase signal and the result of the comparison, said logic signal being applied to a gate of a given one of said field effect transistors so as to selectively controlling an on/off condition of said field effect transistors.

2. A non-volatile semiconductor memory claimed in claim 1 wherein the gate of a first field effect transistor of said plurality of field effect transistors is controlled by only said erase signal so that when said erase signal is active, said first field effect transistor is turned on, and wherein said control circuit includes a comparator for comparing said voltage on said common source line with said reference voltage, and a logic circuit receiving an output of said comparator and said erase signal for outputting a logic signal to the gate of a second field effect transistor of said plurality of field effect transistors, so that when said erase signal is active and when said voltage on said common source line is higher than said reference voltage, said second field effect transistor is turned on, whereby said easing voltage is supplied through said first and second field effect transistor to said common source line.

3. A non-volatile semiconductor memory claimed in claim 2 wherein said control circuit includes a second comparator for comparing said voltage on said common source line with a second reference voltage which is higher than the first mentioned reference voltage, and a second logic circuit receiving an output of said second comparator and said erase signal for outputting a second logic signal to the gate of a third field effect transistor of said plurality of field effect transistors, so that when said erase signal is active and when said voltage on said common source line is higher than said second reference voltage, said third field effect transistor is turned on, whereby said easing voltage is supplied through said first to third field effect transistor to said common source line.

4. In a non-volatile semiconductor memory comprises a plurality of memory cells each composed of a floating gate field effect transistor, an erasing circuit connected to a common source line connected to a source electrode of each of the memory cells, for applying an erasing high voltage to said common source line, said erasing circuit including first and second field effect transistors each of which has a source connected to an erasing voltage and a drain connected to the common source line, said first field effect transistor responding to a given erase signal to apply said erasing voltage to said common source line, and a control circuit for turning on said second field effect transistor when a voltage on said common source line becomes higher than a reference voltage, so that said erasing voltage is supplied through said first and second field effect transistor to said common source line.

* * * * *

UNITED STATES PATENT AND TRADEMARK OFFICE
CERTIFICATE OF CORRECTION

PATENT NO. : 5,608,671
DATED : March 4, 1997
INVENTOR(S) : Kazuhisa NINOMIYA

It is certified that error appears in the above-indentified patent and that said Letters Patent is hereby corrected as shown below:

Column 1, line 55, delete "$\overline{ER+SC0}$" and insert --$\overline{ER_0}$--.

Column 1, line 58, delete "$\overline{ER+SC0}$" and insert --$\overline{ER_0}$--.

Column 4, line 12, delete "$\overline{ER+SC0}$" and insert --$\overline{ER_0}$--.

Column 4, line 22, delete "$\overline{ER+SC0}$" and insert --$\overline{ER_0}$--.

Column 4, line 25, delete "$\overline{ER+SC1}$" and insert --$\overline{ER_1}$--.

Column 4, line 29, delete "$\overline{ER+SC2}$" and insert --$\overline{ER_2}$--.

Column 4, lines 48-49, delete "$\overline{ER+SC0}$, $\overline{ER+SC0}$ (Vpp), $\overline{ER+SC1}$ (Vpp) and $\overline{ER+SC2}$" and insert --$\overline{ER_0}$, $\overline{ER_0}$ (Vpp), $\overline{ER_1}$ (Vpp) and $\overline{ER_2}$--.

UNITED STATES PATENT AND TRADEMARK OFFICE
CERTIFICATE OF CORRECTION

PATENT NO. : 5,608,671
DATED : March 4, 1997
INVENTOR(S) : Kazuhisa NINOMIYA

It is certified that error appears in the above-indentified patent and that said Letters Patent is hereby corrected as shown below:

Column 4, line 54, delete "$\overline{ER+SC0}$" and insert -- $\overline{ER_0}$ --.

Column 5, line 22, delete "$\overline{ER+SC1}$" and insert -- $\overline{ER_1}$ --.

Column 5, line 36, delete "$\overline{ER+SC2}$" and insert -- $\overline{ER_2}$ --.

Signed and Sealed this

First Day of July, 1997

*Attest:*

BRUCE LEHMAN

*Attesting Officer*     *Commissioner of Patents and Trademarks*